US010667341B1

United States Patent
Kriman et al.

(10) Patent No.: US 10,667,341 B1
(45) Date of Patent: May 26, 2020

(54) LIGHT PROJECTOR WITH INTEGRATED INTEGRITY SENSOR

(71) Applicant: Apple Inc., Cupertino, CA (US)

(72) Inventors: Moshe Kriman, Tel Aviv (IL); Adar Magen, Sunnyvale, CA (US); Arun Kumar Nallani Chakravartula, San Jose, CA (US); Zhenbin Ge, San Jose, CA (US); Gregory A. Cohoon, Sunnyvale, CA (US); Eamon H. O'Connor, Emeryville, CA (US); Calvin K. Wong, Cupertino, CA (US); Colleen F. Mischke, Sunnyvale, CA (US); Christopher Hu, San Jose, CA (US); Yazan Z. Alnahhas, Mountain View, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/554,651

(22) Filed: Aug. 29, 2019

Related U.S. Application Data

(60) Provisional application No. 62/731,915, filed on Sep. 16, 2018.

(51) Int. Cl.
*F21V 29/90* (2015.01)
*H05B 33/08* (2020.01)
*G02B 27/42* (2006.01)
*G01R 31/02* (2006.01)
*H01S 5/022* (2006.01)
*H05B 37/02* (2006.01)

(52) U.S. Cl.
CPC ........... *H05B 33/08* (2013.01); *G01R 31/026* (2013.01); *G02B 27/4233* (2013.01); *H01S 5/02248* (2013.01); *H05B 37/0227* (2013.01)

(58) Field of Classification Search
CPC ............... H05B 37/02; H05B 37/0227; H05B 37/0272; H05B 33/08; H05B 33/0815; H05B 33/0842; H05B 33/0845; H05B 33/0881; H01S 5/02248; G01R 31/026; G02B 27/4233; G02B 13/0065; G02B 13/0085; G02B 27/425; F21V 29/90; F21V 25/04; G03B 21/142; G03B 2205/0084; H04N 5/2254; H04N 9/3144; H04N 9/3161; H04N 9/3173
See application file for complete search history.

(56) References Cited

U.S. PATENT DOCUMENTS

| | | |
|---|---|---|
| 4,951,150 A | 8/1990 | Browning |
| 5,389,911 A | 2/1995 | Madau et al. |
| 5,606,181 A | 2/1997 | Sakuma et al. |
| 7,986,473 B2 | 7/2011 | Bloch et al. |
| 8,150,142 B2 | 4/2012 | Freedman et al. |

(Continued)

FOREIGN PATENT DOCUMENTS

JP    H03237303 A    10/1991

*Primary Examiner* — Jimmy T Vu
(74) *Attorney, Agent, or Firm* — Kligler & Associates Patent Attorneys Ltd

(57) ABSTRACT

An optical module includes a diffractive optical element (DOE) with a transparent conductive trace disposed over a surface of the DOE. An emitter is configured to direct a beam of optical radiation through the DOE. Control circuitry is coupled to measure a resistance of the transparent conductive trace and to control operation of the emitter responsively to the resistance.

20 Claims, 10 Drawing Sheets

(56) References Cited

U.S. PATENT DOCUMENTS

| | | | |
|---|---|---|---|
| 8,872,668 B2 | 10/2014 | Schhare | |
| 8,958,011 B2 | 2/2015 | Park et al. | |
| 9,091,413 B2 | 7/2015 | Petronius et al. | |
| 9,939,721 B2 | 4/2018 | Kriman et al. | |
| 10,146,112 B2 | 12/2018 | Kurata | |
| 10,146,116 B2 | 12/2018 | Kriman et al. | |
| 10,174,931 B2 * | 1/2019 | Sawyer | F21V 29/90 |
| 2002/0135996 A1 | 9/2002 | Suga | |
| 2005/0135743 A1 | 6/2005 | Ascanio et al. | |
| 2006/0252169 A1 | 11/2006 | Ashida | |
| 2007/0177363 A1 | 8/2007 | Jayanetti | |
| 2008/0240502 A1 | 10/2008 | Freedman et al. | |
| 2009/0059979 A1 | 3/2009 | Tanaka | |
| 2009/0185274 A1 | 7/2009 | Shpunt | |
| 2010/0053604 A1 | 3/2010 | Rice | |
| 2011/0273600 A1 | 11/2011 | Kriman et al. | |
| 2012/0013880 A1 | 1/2012 | Choi et al. | |
| 2012/0206046 A1 | 8/2012 | Huang et al. | |
| 2012/0275149 A1 | 11/2012 | Huang | |
| 2014/0230553 A1 | 8/2014 | Vokey et al. | |
| 2015/0249521 A1 | 9/2015 | Ono et al. | |
| 2015/0276547 A1 | 10/2015 | Shpunt | |
| 2017/0075205 A1 | 3/2017 | Kriman et al. | |
| 2019/0227421 A1 | 7/2019 | Kriman et al. | |

* cited by examiner

LIGHT PROJECTOR WITH INTEGRATED INTEGRITY SENSOR

CROSS-REFERENCE TO RELATED APPLICATION

This application claims the benefit of U.S. Provisional Patent Application 62/731,915, filed Sep. 16, 2018, which is incorporated herein by reference.

FIELD OF THE INVENTION

The present invention relates generally to optical devices, and particularly to modules and methods for projection of optical radiation.

BACKGROUND

Optical modules are commonly used in consumer electronic devices. For example, almost all current portable telephones and computers include a miniature camera module. Miniature optical projection modules are also coming into increasing use in portable consumer devices for a variety of purposes.

Such projection modules may be used, for example, to cast a pattern of structured light onto an object for purposes of 3D mapping (also known as depth mapping). In some systems of this sort a light source, such as a laser diode or LED, transilluminates a transparency with optical radiation so as to project a pattern onto the object. (The terms "optical" and "light" as used in the present description and in the claims refer generally to any and all of visible, infrared, and ultraviolet radiation.) An image capture assembly captures an image of the pattern that is projected onto the object, and a processor processes the image so as to reconstruct a three-dimensional (3D) map of the object.

Optical projectors may, in some applications, project light through one or more diffractive optical elements (DOEs). In some cases two DOEs can be used together to diffract an input beam while reducing the energy in the zero-order (undiffracted) beam. The DOEs may be mechanically sealed to a substrate to help protect and ensure their integrity.

SUMMARY

Embodiments of the present invention that are described hereinbelow provide integrated optical devices with enhanced reliability and integrity.

There is therefore provided, in accordance with an embodiment of the invention, an optical module, including a diffractive optical element (DOE) and a transparent conductive trace disposed over a surface of the DOE. An emitter is configured to direct a beam of optical radiation through the DOE. Control circuitry is coupled to measure a resistance of the transparent conductive trace and to control operation of the emitter responsively to the resistance.

In a disclosed embodiment, an increase in the resistance is indicative of a break in the transparent conductive trace, and the control circuitry is configured to inhibit the operation of the emitter responsively to the increase in the resistance. Typically, the transparent conductive trace is disposed in a serpentine pattern across an active optical area of the DOE. In one embodiment, the transparent conductive trace includes indium tin oxide (ITO).

In some embodiments, the DOE is configured to diffract the beam of optical radiation so as to create a pattern of structured light. Additionally or alternatively, the emitter includes a laser diode.

In some embodiments, the surface of the DOE on which the transparent conductive trace is disposed is an interior surface, and the module includes contact pads, in electrical communication with the conductive trace, on an exterior surface of the DOE for connection to the control circuitry. In one embodiment, the module includes vias, which pass through one or more layers of the DOE from the interior surface to the exterior surface and connect the conductive trace to the contact pads.

Additionally or alternatively, the DOE includes a transparent substrate having a first index of refraction at an emission wavelength of the emitter, wherein the transparent conductive trace has a second index of refraction at the emission wavelength of the emitter. An index-matching layer, which has a third index of refraction, intermediate the first and second indexes of refraction, at the emission wavelength of the emitter, is disposed between the transparent substrate and the transparent conductive trace. In a disclosed embodiment, the third index of refraction is chosen so as to minimize a reflection of the optical radiation at the emission wavelength of the emitter by the transparent conductive trace.

In some embodiments, the module includes a housing containing the emitter and the control circuitry, and having an opening in which the DOE is mounted. Conductive traces are embedded in the housing and connect the transparent conductive trace disposed over the surface of the DOE to the control circuitry. In one embodiment, the housing includes a plastic material, and the conductive traces include metal leads, which are molded into the plastic material. Alternatively or additionally, the conductive traces include a metal plated onto an inner surface of the housing.

There is also provided, in accordance with an embodiment of the invention, a method for projecting light, which includes providing a diffractive optical element (DOE) having a transparent conductive trace disposed over a surface of the DOE. A beam of optical radiation is directed from an emitter through the DOE. A resistance of the transparent conductive trace is measured, and the operation of the emitter is controlled responsively to the resistance.

The present invention will be more fully understood from the following detailed description of the embodiments thereof, taken together with the drawings in which:

DETAILED DESCRIPTION OF EMBODIMENTS

Figure 1:
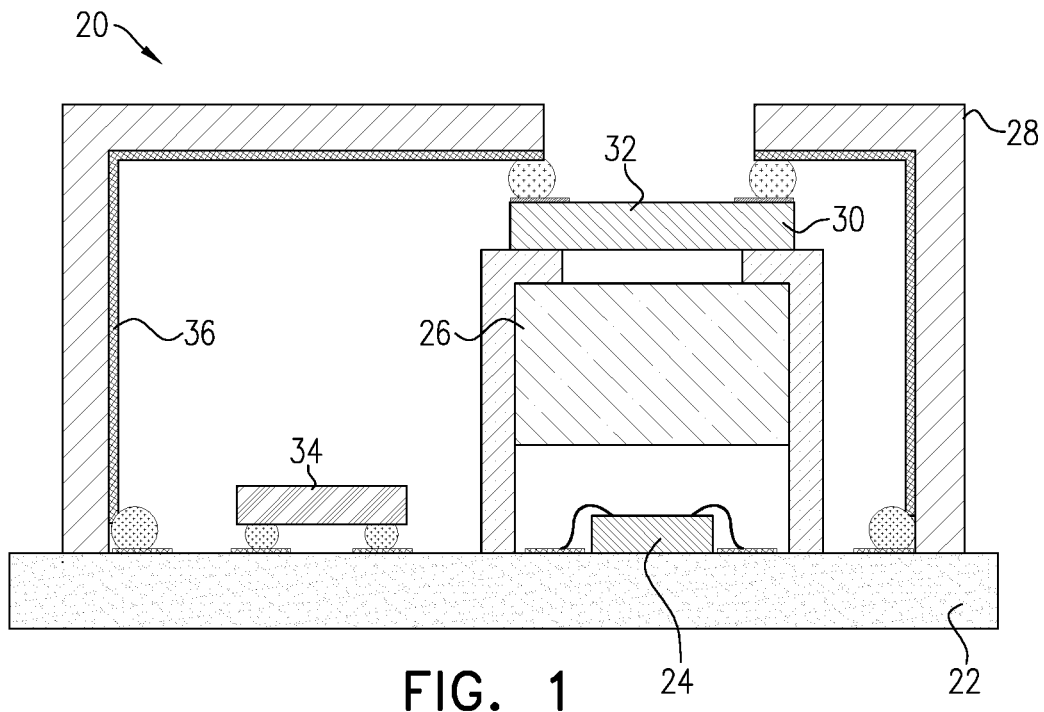
FIG. 1 is a schematic sectional view of an optical module with an integrated integrity sensor, in accordance with an embodiment of the invention.

Mass production of miniaturized optical devices calls for product designs that meet the often-conflicting objectives of high precision and reliability and low manufacturing cost. For example, a miniature projection module may be configured to project a structured light pattern, and images of the pattern captured by a camera module may then be processed for purposes of depth mapping. Loss of mechanical integrity, for instance if a mechanical or thermal shock causes the patterning element in a projection module, such as a DOE or other patterned transparency, to break, or even just crack, may cause the module to malfunction.

Embodiments of the present invention that are described herein address these problems by incorporating electrical traces and control circuitry into integrated optical modules, in order to detect and handle faults of this sort. These embodiments provide means for detecting loss of mechanical integrity in such a module, so that inhibitory action can be taken (such as shutting off the light emitter in a projection module). Although the disclosed embodiments relate specifically to projection modules, the principles of the present invention may similarly be applied, mutatis mutandis, in enhancing the performance of other sorts of miniaturized and integrated optical modules.

In the disclosed embodiments, an optical module comprises a DOE, with a transparent conductive trace disposed over a surface of the DOE. An emitter directs a beam of optical radiation through the DOE, for example to create a pattern of structured light. Control circuitry is coupled to measure the resistance of the transparent conductive trace and to control operation of the emitter responsively to the resistance. Changes in the resistance of the transparent conductive trace can be indicative of faults, leading to corrective action by the control circuitry. For example, an increase in the resistance can indicate that the transparent conductive trace has broken. The control circuitry will inhibit the operation of the emitter, reducing the beam power and possibly shutting off the emitter entirely, when the resistance increases above some threshold.

In some embodiments, the transparent conductive trace is disposed in a serpentine pattern across an active optical area of the DOE in order to ensure detection of any possible cracks or other damage that may develop. The term "transparent" is used in the context of the present description and in the claims to mean that the trace transmits at least 90% of incident optical radiation at the emission wavelength of the emitter.

Typically, however, the index of refraction of the transparent conductive trace at this emission wavelength is substantially greater than that of the transparent substrate of the DOE. To avoid loss of beam power due to reflection as a result of this index mismatch, an index-matching layer, which has an intermediate index of refraction, between the indexes of refraction of the substrate and the conductive trace, is disposed between the substrate and the trace. The index of refraction of the index-matching layer is chosen so as to minimize the reflection of the optical radiation at the emission wavelength of the emitter by the transparent conductive trace, thus in effect rendering the trace nearly completely transparent at this wavelength.

FIG. 1 is a schematic sectional view of an optical module 20 with an integrated integrity sensor, in accordance with an embodiment of the invention. In this embodiment, an emitter 24, such as a chip containing a laser diode or laser diode array, is mounted on a substrate 22, which may comprise a silicon wafer or a dielectric material, such as a suitable polymer, alumina or ceramic.

Emitter 24 emits a beam of optical radiation (which may be visible, infrared and/or ultraviolet) through an optical stack 26. In the pictured embodiment, emitter 24 comprises a vertical-cavity surface-emitting laser (VCSEL), which emits radiation vertically away from substrate. Alternatively, module 20 may comprise multiples VCSELs, for example, or one or more edge-emitting lasers, together with a suitable turning mirror (not shown), or any other suitable type of top- or edge-emitting device. Lenses in optical stack 26 collimate and direct the radiation from emitter 24 through an optical output element, for example a patterning element such as a diffractive optical element (DOE) 30, which diffracts the radiation so as to produce a pattern of structured light that can be projected onto a scene. Additionally or alternatively, optical stack 26 may comprise other components, such as a diffuser.

For purposes of integrity sensing, an integrity sensor 32, comprising a transparent conductive trace, is disposed over a surface of DOE 30. (Details of the structure of sensor 32 are shown in the figures that follow.) Sensor 32 is connected to control circuitry 34, which provides a drive current to emitter 24. Circuitry 34 measures the resistance of the trace of sensor 32 and controls operation of emitter 24 accordingly. Sensor 32 may be connected to circuitry 34, for example, by connecting traces 36 running along an inner surface of a housing 28 of module 20, or by any other suitable sort of electrical connection. Emitter 24 and control circuitry 34 are contained in housing 28, which has an opening in which DOE 30 is mounted.

Figure 11A:
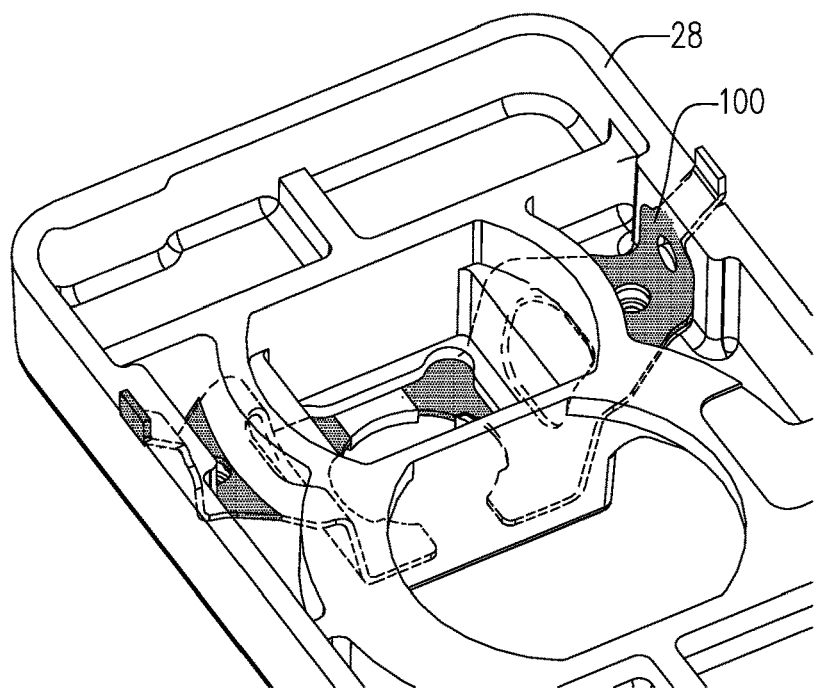
FIG. 11A is a schematic pictorial view of the housing of an optical module showing electrical traces molded into the housing, in accordance with an embodiment of the invention.
Figure 11B:
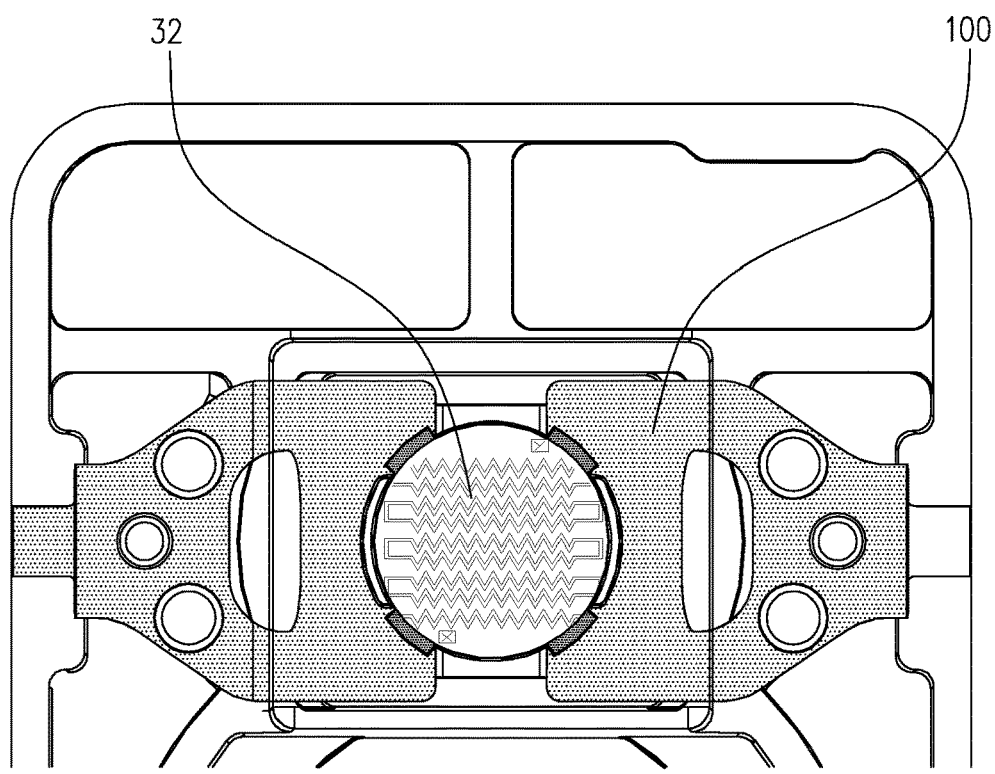
FIG. 11B is a schematic frontal view of the housing of FIG. 11A, showing a DOE connected to the electrical traces molded into the housing, in accordance with an embodiment of the invention.
Figure 11C:
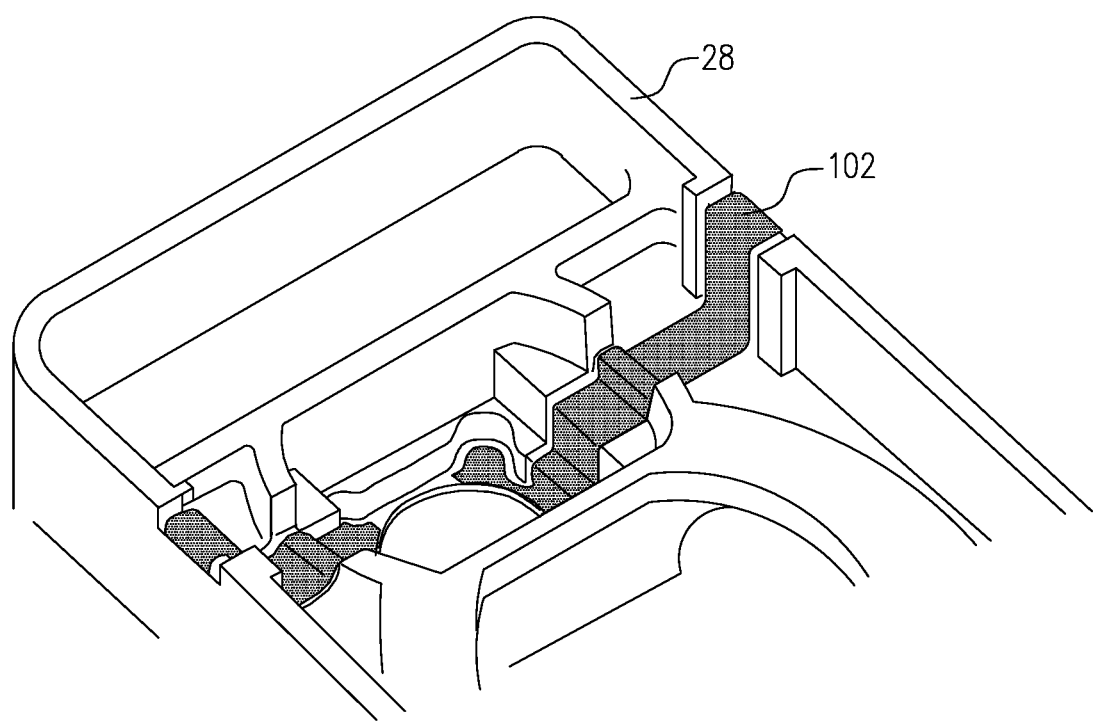
FIG. 11C is a schematic pictorial view of the housing of an optical module showing electrical traces plated onto an inner surface of the housing, in accordance with another embodiment of the invention.

Housing 28 may comprise a suitable polymer, for example, in which case traces 36 are embedded, for example by molding or deposition on the polymer, using any suitable process that is known in the art. Traces 36 are connected to sensor 32 and to circuitry 34 by a conductive adhesive, such as conductive epoxy, or by soldering, for example. Details of the design and production of traces 36 in housing are shown in FIGS. 11A-C and described with reference to these figures hereinbelow. Embedding the traces into housing 28 provides a more robust design and reduces potential failure modes.

Control circuitry 34 in the pictured embodiment is embodied in an integrated circuit chip, such as an application-specific integrated circuit (ASIC), which is mounted on substrate 22. Alternatively, the functions of control circuitry 34 may be distributed among a number of separate electronic components in module 20. Control circuitry 34 comprises a suitable analog interface to measure the resistance of the trace in sensor 32, as well as a drive circuit, which generates an output current at the appropriate voltage to drive emitter 24 (in either pulsed or continuous mode), along with programmable or hard-wired hardware logic circuits.

The hardware logic circuits in control circuitry 34 control operation of the emitter based on the measured resistance of the trace in sensor 32, and will inhibit operation of the emitter when the resistance changes (increases or decreases) by more than a certain limit, which may be fixed or programmable. In particular, when the resistance increases sufficiently to indicate that the trace in sensor 32 may have broken, control circuitry 34 will shut off emitter 24 entirely, typically by shutting down the current provided to emitter 24. By appropriate configuration of sensor 32 and circuitry 34, the hardware logic circuits are able to detect conditions such as damage to DOE 30 or detachment of the DOE from housing 28. Thus, the potential of unwanted emission from optical module 20 due to compromised integrity of DOE 30 will be avoided.

Figure 2:
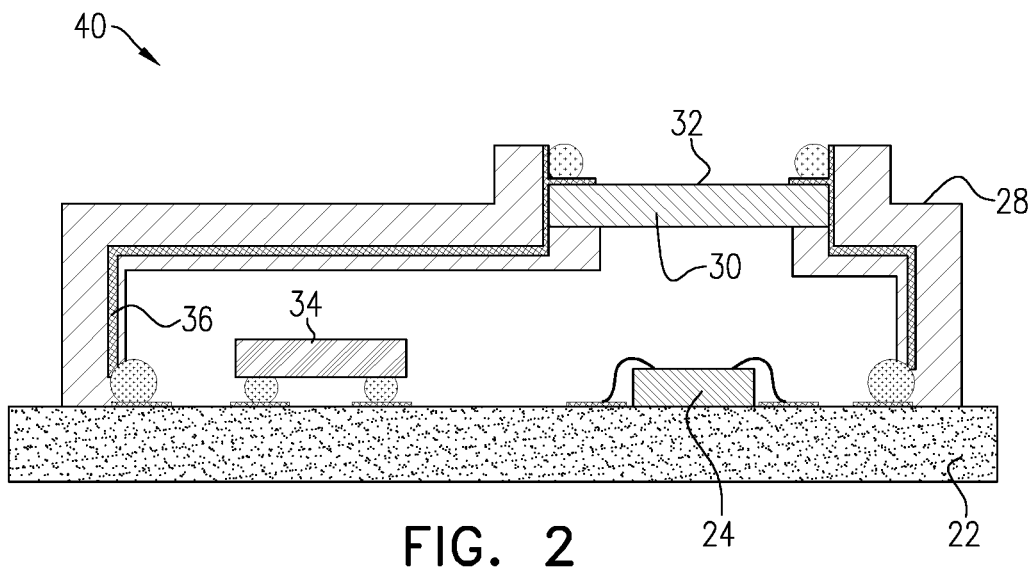
FIG. 2 is a schematic sectional view of an optical module with an integrated integrity sensor, in accordance with another embodiment of the invention.

FIG. 2 is a schematic sectional view of an optical module 40 with an integrated integrity sensor, in accordance with another embodiment of the invention. The components and principles of operation of module 40 are similar to those of module 20, as described above, but module 40 does not include an optical stack separate from DOE 30. In this case, the DOE itself may perform focusing and/or collimating functions, for example, in addition to pattern generation. In addition, connecting traces 36 in module 40 are embedded in housing 28, rather than running along the inner surface as in the preceding embodiments.

In other embodiments (not shown in the figures), a module with an integrated integrity sensor of this sort also comprises other components, such as a detector for collecting and sensing the projected radiation that is reflected back from a scene to the module.

Figure 3A:
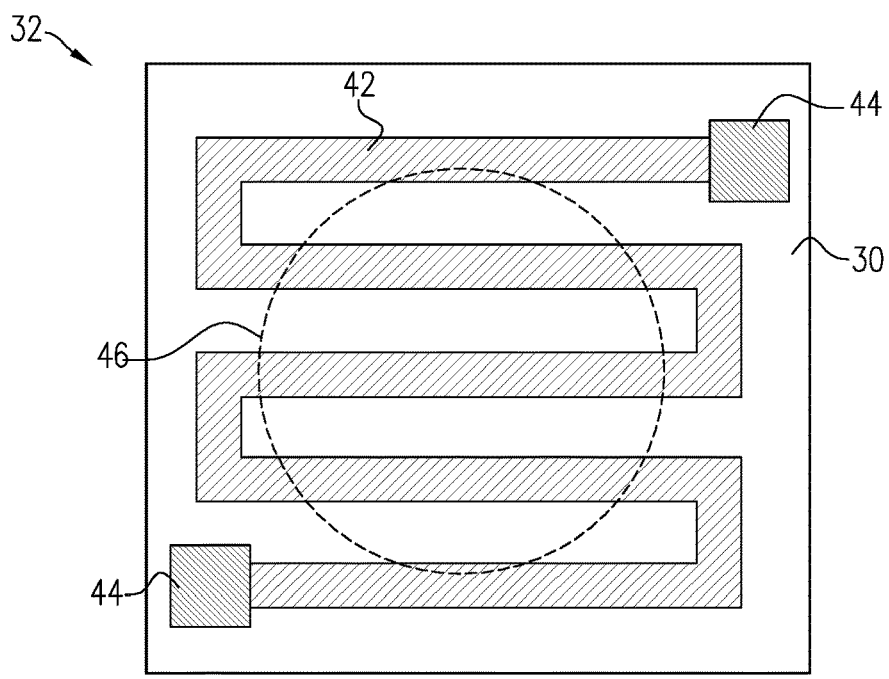
FIGS. 3A and 3B are schematic frontal and sectional views, respectively, of a DOE on which a transparent conductive trace has been formed for purposes of integrity sensing, in accordance with an embodiment of the invention.
Figure 3B:
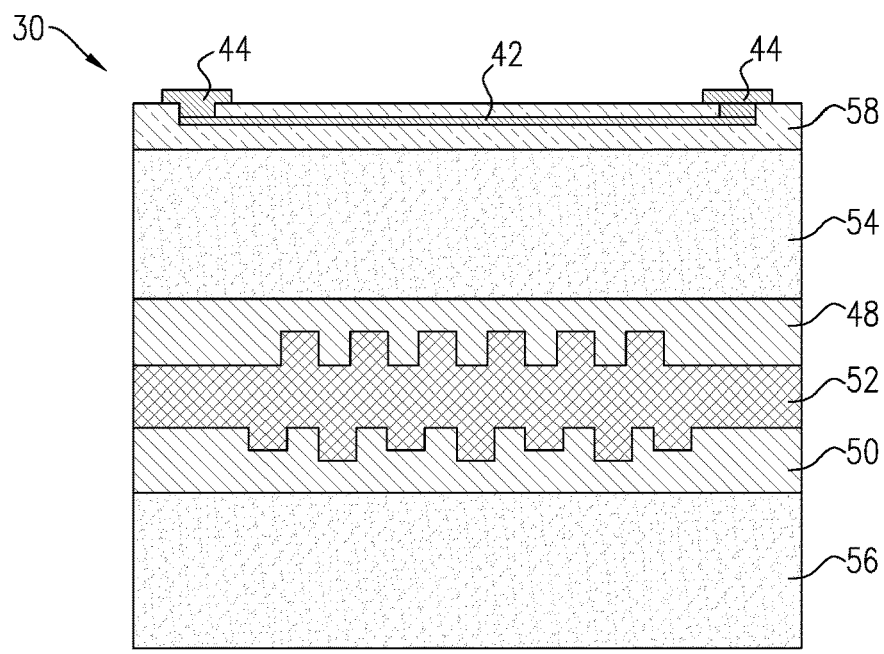

FIGS. 3A and 3B are schematic frontal and sectional views, respectively, of DOE 30 on which a transparent conductive trace 42 of sensor 32 has been formed for purposes of integrity sensing, in accordance with an embodiment of the invention. Transparent conductive trace 42 is disposed in a serpentine pattern across an active optical area 46 of the DOE. For example, trace 42 may comprise indium tin oxide (ITO), which is sputtered or otherwise deposited on the surface of DOE 30, and is then patterned, using photolithographic methods that are known in the art, to define the desired form. Contact pads 44 are provided at the ends of trace 42 for connection (via traces 36 or other means) to control circuitry 34.

DOE 30 may be produced by any suitable technique that is known in the art, such as photolithographic etching or replication. These techniques, along with the deposition of trace 42, may be implemented in wafer-scale manufacturing, in which multiple DOEs 30, with the corresponding traces 42, are produced on a transparent wafer and then diced to singulate the DOEs. In the embodiment that is shown in FIG. 3B, DOE 30 comprises two gratings 48, 50, which are formed on respective surfaces of transparent substrates 54 and 56, comprising glass or a suitable polymer, for example. Gratings 48 and 50 are then bonded together by an intermediate layer of a bonding material 52. Typically, gratings 48 and 50 comprise a material with a high index of refraction, while bonding material 52 has a low index; but alternatively, gratings 48 and 50 may have a low index, while bonding material 52 has a high index. Other DOE configurations are shown in the figures that follow.

Trace 42 may be formed on an exterior surface of DOE 30, or it may alternatively be covered by or encapsulated in a dielectric layer 58, which provides mechanical protection and may also perform index-matching functions, as described below. Dielectric layer 58 may comprise a passivation layer, such as a layer of $SiO_2$ or SiN. Openings may be etched through layer 58 to connect pads 44 to trace 42.

Figure 4A:
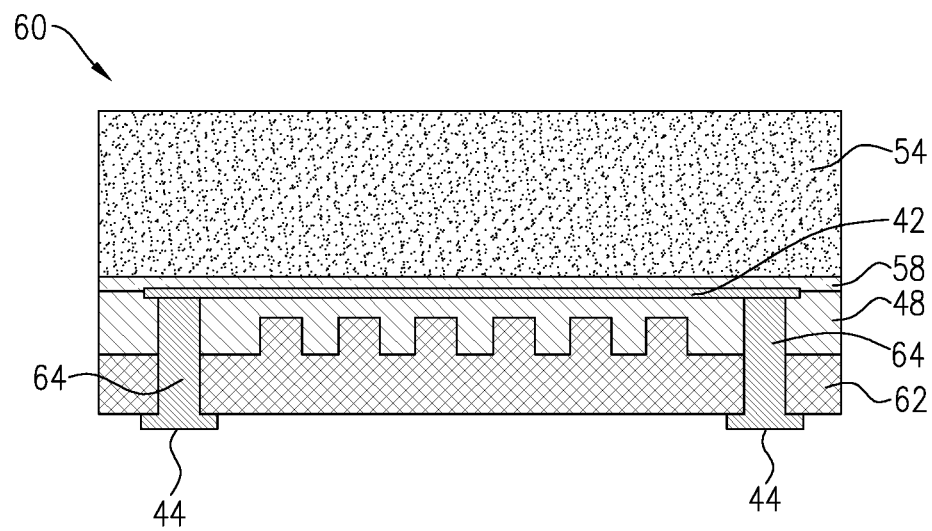
FIGS. 4A and 4B are schematic sectional views of DOEs on which transparent conductive traces have been formed for purposes of integrity sensing, in accordance with other embodiments of the invention.
Figure 4B:
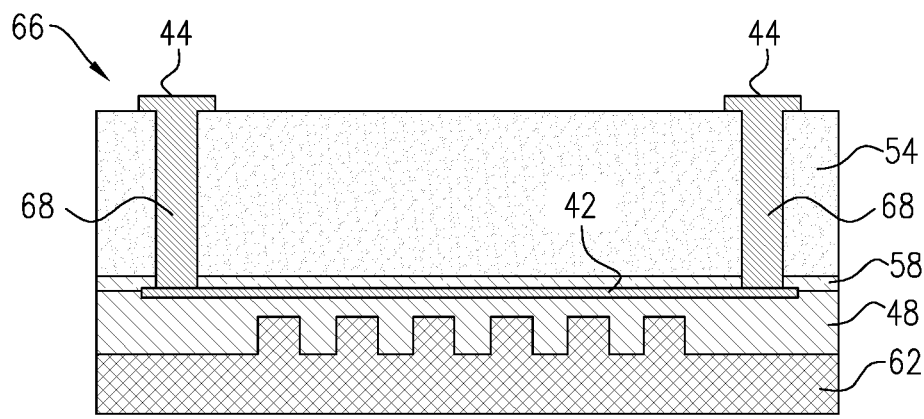
Figure 5A:
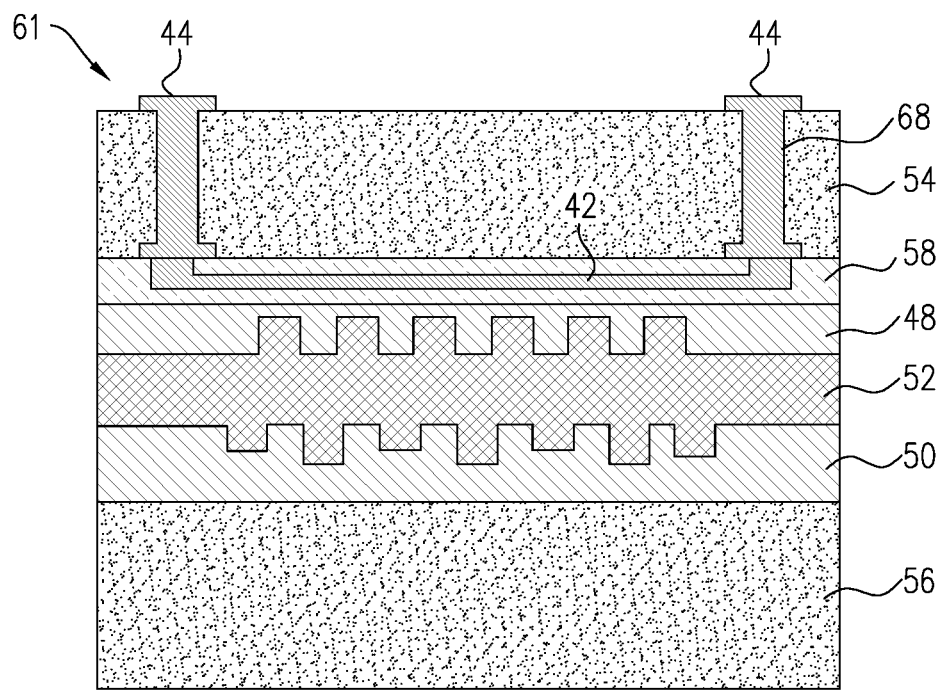
FIGS. 5A-5D are schematic sectional views of DOEs on which transparent conductive traces have been formed for purposes of integrity sensing, in accordance with alternative embodiments of the invention.
Figure 5B:
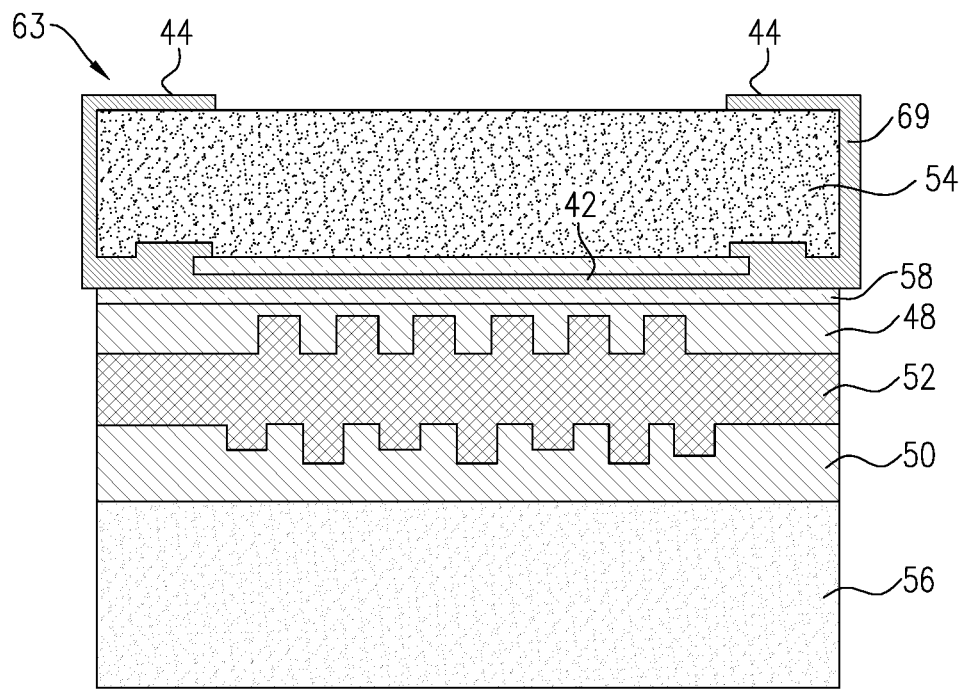
Figure 5C:
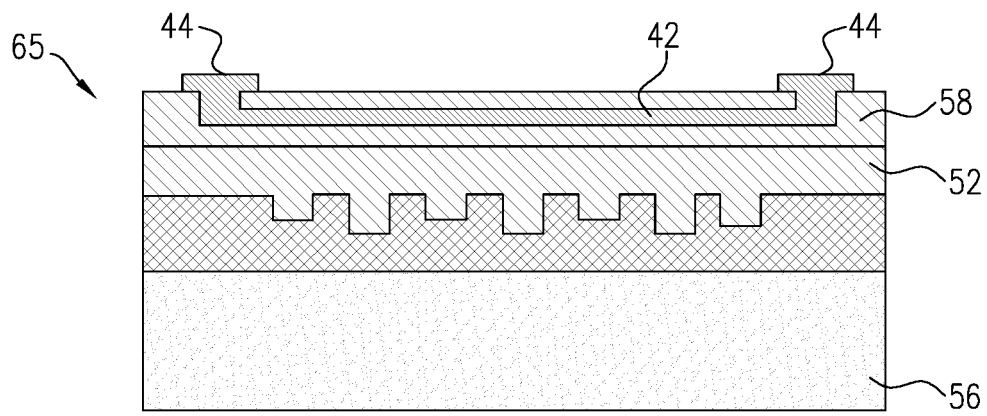
Figure 5D:
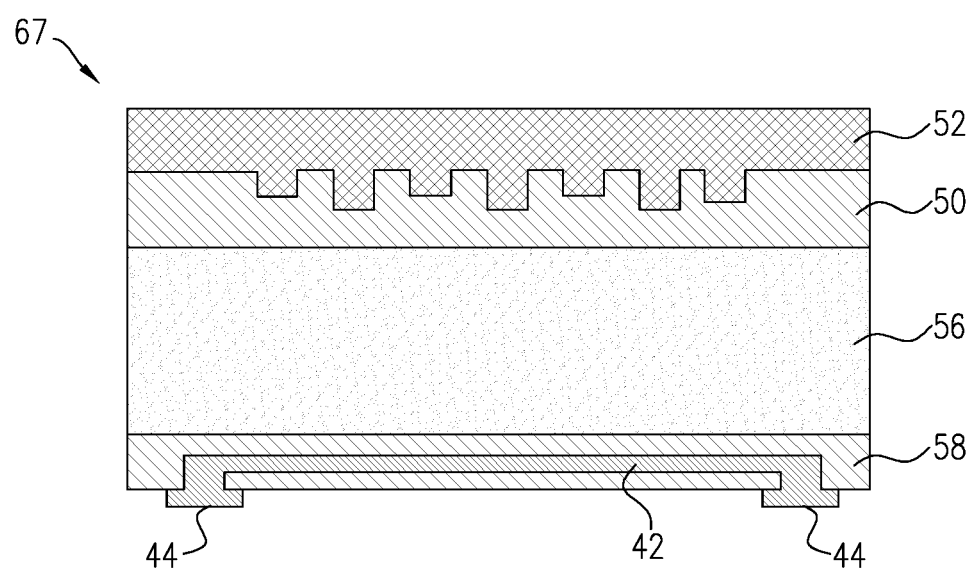

FIGS. 4A and 4B are schematic sectional views of DOEs 60 and 66, respectively, on which transparent conductive traces 42 have been formed for purposes of integrity sensing, in accordance with other embodiments of the invention. In both of these embodiments, the DOE comprises only a single grating 48, which is covered by a fill layer 62, having a different refractive index (lower or higher) than that of grating 48. In both of DOEs 60 and 66, transparent conductive trace 42 is formed on an interior surface, while contact pads 44 are formed on an exterior surface of the DOE for connection to control circuitry 34 (FIG. 1). Trace 42 is therefore connected to contact pads 44 by metal-filled vias 64 or 68. Vias 64 pass through fill layer 62 of DOE 60, while vias 68 pass through substrate 54 of DOE 66.

FIGS. 5A-5D are schematic sectional views of DOEs 61, 63, 65 and 67, on which transparent conductive traces 42 have been formed for purposes of integrity sensing, in accordance with alternative embodiments of the invention. The components of these DOEs are marked with the same indicator numbers as in the preceding figures, and the configurations of DOEs 61, 65 and 67 will thus be self-evident on the basis of the figures and the foregoing description. In DOE 61 (FIG. 5A), trace 42 is connected to contact pads by 44 by vias 68 passing through substrate 54. In DOE 63 (FIG. 5B), electrodes 44 and connected to transparent conductive trace 42 by metal traces 69 that are formed along the sides of substrate 54. In DOE 65 (FIG. 5C), trace 42 is encapsulated in dielectric layer 58 and is connected to pads 44 by openings etched through the dielectric layer. In DOE 67 (FIG. 5D), dielectric layer 58 is formed on the opposite side of substrate 56, and trace 42 is encapsulated in this dielectric layer 58 with connections to pads 44 etched through the dielectric layer.

Figure 6:
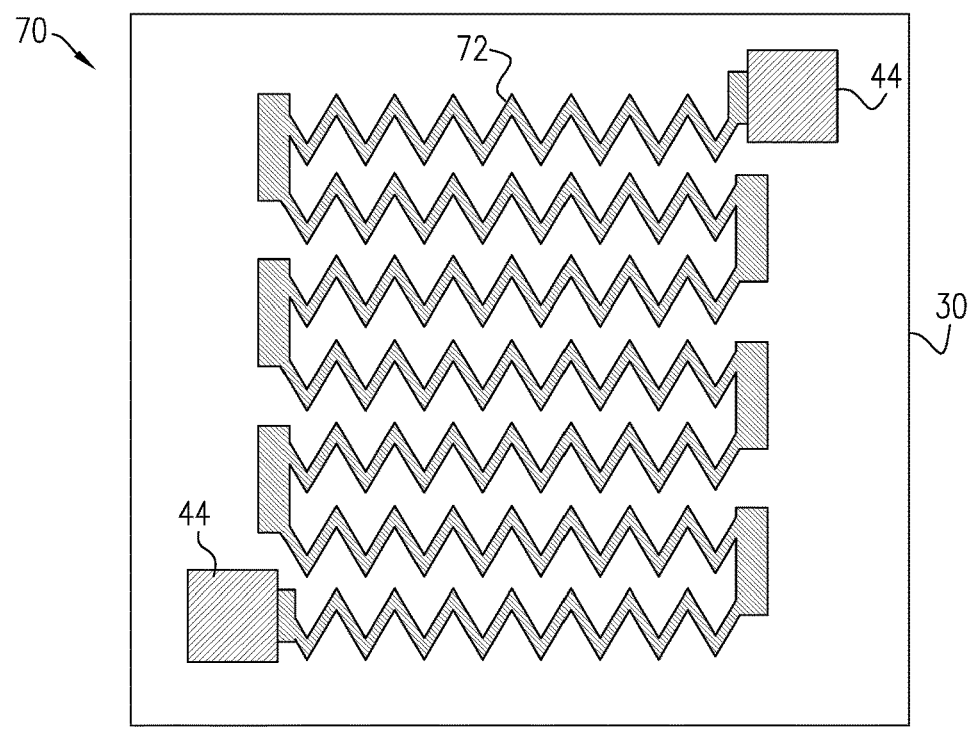
FIGS. 6 and 7 are schematic frontal views of DOEs on which transparent conductive traces have been formed for purposes of integrity sensing, in accordance with further embodiments of the invention.
Figure 7:
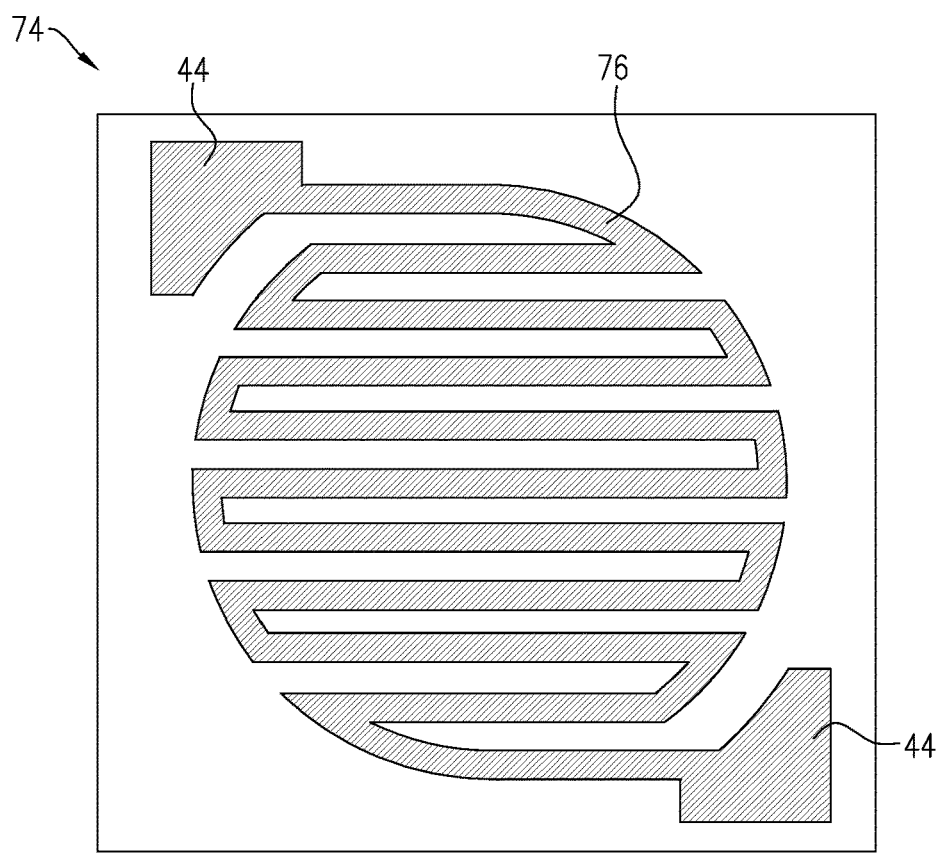

FIGS. 6 and 7 are schematic frontal views of DOEs 70 and 74, respectively, on which serpentine transparent conductive traces 72, 76 have been formed for purposes of integrity sensing, in accordance with further embodiments of the invention. Trace 72 is formed in a zigzag pattern, which both increases the baseline resistance of the trace and gives denser coverage of the surface of DOE 70, thus enabling finer detection of small, local defects in the DOE. Trace 76 is shaped to fit the active optical area of DOE 74. Alternatively, traces of other suitable shapes, patterns, densities and extents may be used, depending upon application requirements.

Figure 8:
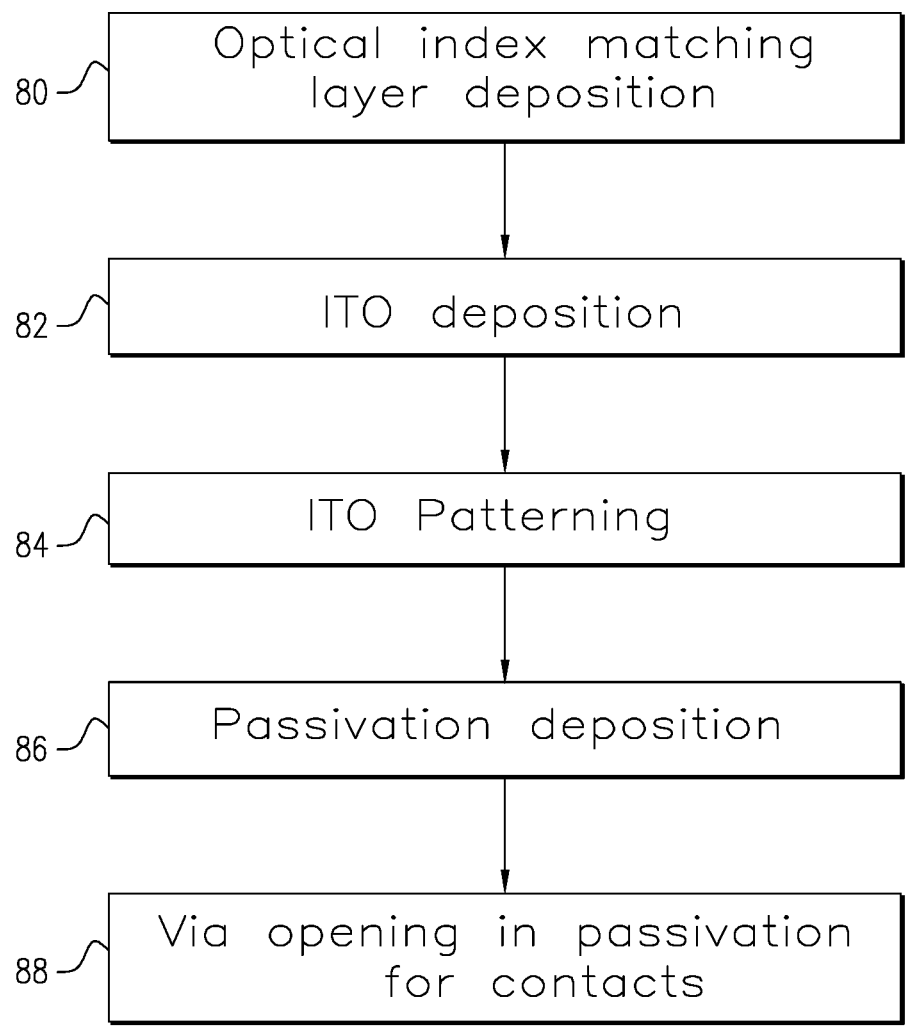
FIG. 8 is a flow chart that schematically illustrate a method for producing a DOE with an integrated intensity sensor, in accordance with an embodiment of the invention.

FIG. 8 is a flow chart that schematically illustrate a method for producing an integrated intensity sensor on a DOE, in accordance with an embodiment of the invention. The method may be carried out in a wafer-scale process, after production of the DOE layers and before singulation.

Figure 9:
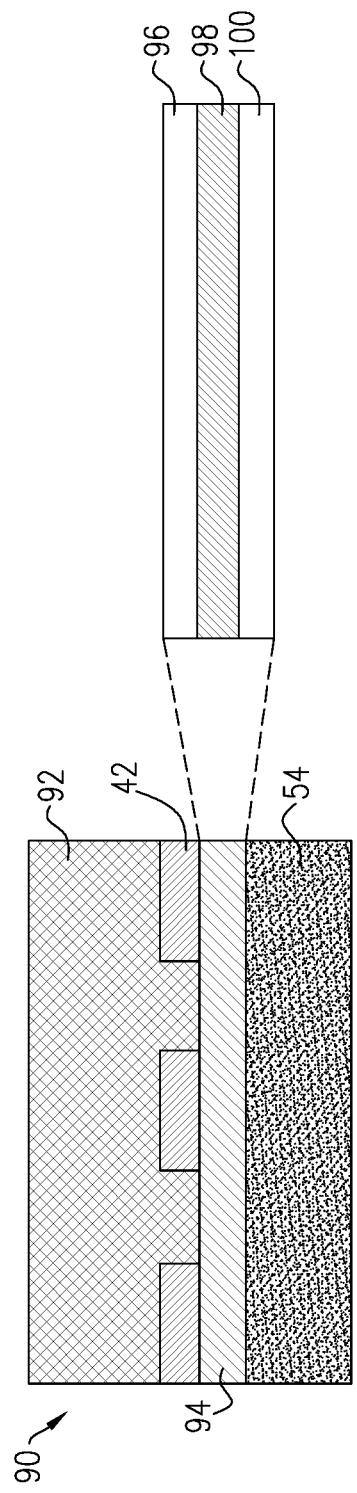
FIG. 9 is a schematic sectional view of a DOE on which a transparent conductive trace has been formed, showing details of optical index matching layers on the DOE in accordance with an embodiment of the invention.
Figure 10:
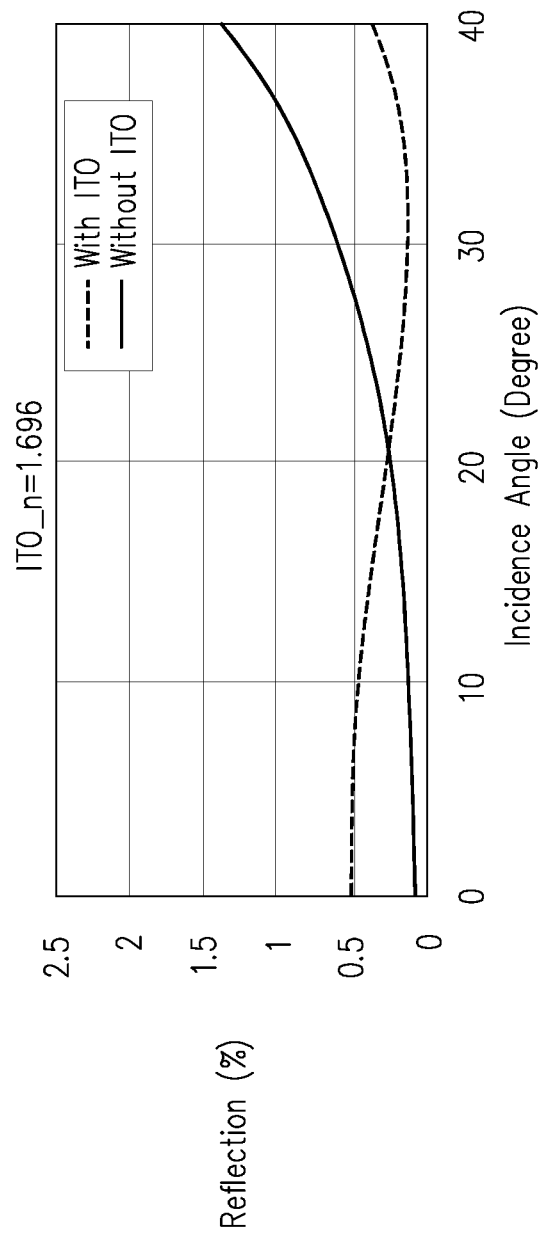
FIG. 10 is a plot that schematically shows reflectance of a DOE on which a transparent conductive trace has been formed, in accordance with an embodiment of the invention.

An optical index-matching layer is deposited over an outer surface of the DOE, such as over substrate 54, at an index matching step 80. Assuming substrate 54 to have a certain index of refraction at the emission wavelength of emitter 24 (FIGS. 1-2), and that the transparent conductive trace of integrity sensor 32 will have a different index of refraction at this wavelength—typically greater than the index of refraction of the substrate—the index-matching layer will be designed to have index of refraction that is intermediate between the indexes of refraction of the substrate and the sensor trace. The index of refraction of the index-matching layer is chosen so as to minimize reflection of the optical radiation at the emission wavelength of emitter 24 by the transparent conductive trace. FIGS. 9 and 10 show an example of such a design.

A layer of ITO is then deposited over the index-matching layer, at an ITO deposition step 82. The ITO is patterned, for example by photolithographic etching, to produce the desired trace, at a patterning step 84. A passivation layer is then deposited over the ITO trace, at a passivation step 86. Vias are etched through the passivation layer to the ends of the trace, and are filled with metal to enable contact with pads 44, at a via production step 88.

FIG. 9 is a schematic sectional view of a DOE 90 on which transparent conductive trace 42 has been formed, in accordance with an embodiment of the invention. An index-matching layer 94 is deposited over substrate 54, after which trace 42 is formed over the index-matching layer, and a passivation layer 92 is then deposited over the trace. As shown in the inset on the right side of FIG. 9, index-matching layer 94 in this example comprises an intermediate layer 98 of SiOH, sandwiched between upper and lower layers 96 and 100 of SiO2. Good index-matching can be achieved using the following layer thicknesses, for instance: layer 96—39.1 nm; layer 98—44.4 nm; and layer 100—20.3 nm. Alternative designs will be apparent to those skilled in the art and are considered to be within the scope of the present invention.

FIG. 10 is a plot that schematically shows reflectance of DOE 90, based on the above design parameters, in accordance with an embodiment of the invention. ITO has an index of refraction of 1.696 at near-infrared wavelengths. In the absence of index-matching layer 94, this high index of refraction would result in reflection of roughly 10% of the radiation that is incident on the interface between substrate 54 and trace 42. Index-matching layer 94, however, reduces the reflection due to trace 42 to less than 0.5% for all angles of incidence up to about 30°. The reflection by passivation layer 92 in the area between the lines of trace 42 is likewise held below 0.5% in this angular range. Therefore, trace 42 is effectively nearly invisible to the incident radiation and has only a negligible effect on the radiation emitted from the optical module.

Reference is now made to FIGS. 11A and 11B, which schematically illustrate electrical traces 100 embedded into housing 28 of an optical module for connection of sensor 32 on the surface of a DOE to control circuitry (not shown in this figure), in accordance with an embodiment of the invention. Traces 100 can take the place of traces 36 in modules 20 and 40 that are shown in FIGS. 1 and 2. FIG. 11A is a schematic pictorial view of housing 28, while FIG. 11B is a schematic frontal view of the housing of FIG. 11A, showing sensor 32 connected to traces 100. In this embodiment, housing 28 is made from a plastic material. To create traces 100, metal leads are inserted into the plastic mold, and the plastic is then around the metal leads.

FIG. 11C is a schematic pictorial view of housing 28 of an optical module showing electrical traces 102 plated onto an inner surface of the housing, in accordance with another embodiment of the invention. In this embodiment, traces 102 are produced by laser direct structuring (LDS). This process, as is known in the art, uses a special type of plastic resin which, when exposed to a specific laser power will activate the surface of the part so that it can then be plated with a metal. The interior surfaces of housing 28 can then be selectively metal plated with this process to create embedded traces 102 running along a continuous path, which can connect sensor 32 to control circuitry.

The preceding figures illustrate a typical implementation of integrity control circuits and techniques, in accordance with example embodiments of the invention. The principles of these circuits and techniques, however, may similarly be implemented in other sorts of optical modules, with different sorts of trace configurations and control circuits, as will be apparent to those skilled in the art after reading the present disclosure. Although the embodiments described above related specifically to certain types of optical projection modules with DOEs for projection of structured light, and with particular module geometries, the principles of the present invention may similarly be applied to optical modules of other sorts, with different types of optical output and patterning elements and other geometries. All such alternative implementations of these principles are considered to be within the scope of the present invention.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optical module, comprising:
   a diffractive optical element (DOE);
   a transparent conductive trace disposed over a surface of the DOE;
   an emitter, which is configured to direct a beam of optical radiation through the DOE; and
   control circuitry, which is coupled to measure a resistance of the transparent conductive trace and to control operation of the emitter responsively to the resistance.

2. The module according to claim 1, wherein an increase in the resistance is indicative of a break in the transparent conductive trace, and the control circuitry is configured to inhibit the operation of the emitter responsively to the increase in the resistance.

3. The module according to claim 1, wherein the DOE is configured to diffract the beam of optical radiation so as to create a pattern of structured light.

4. The module according to claim 1, wherein the transparent conductive trace is disposed in a serpentine pattern across an active optical area of the DOE.

5. The module according to claim 1, wherein the surface of the DOE on which the transparent conductive trace is disposed is an interior surface, and wherein the module comprises contact pads, in electrical communication with the conductive trace, on an exterior surface of the DOE for connection to the control circuitry.

6. The module according to claim 5, and comprising vias, which pass through one or more layers of the DOE from the interior surface to the exterior surface and connect the conductive trace to the contact pads.

7. The module according to claim 1, wherein the DOE comprises:
   a transparent substrate having a first index of refraction at an emission wavelength of the emitter, wherein the transparent conductive trace has a second index of refraction at the emission wavelength of the emitter; and an index-matching layer, which has a third index of refraction, intermediate the first and second indexes of refraction, at the emission wavelength of the emitter, and is disposed between the transparent substrate and the transparent conductive trace.

8. The module according to claim 7, wherein the third index of refraction is chosen so as to minimize a reflection of the optical radiation at the emission wavelength of the emitter by the transparent conductive trace.

9. The module according to claim 1, wherein the emitter comprises a laser diode.

10. The module according to claim 1, wherein the transparent conductive trace comprises indium tin oxide (ITO).

11. The module according to claim 1, and comprising:
a housing containing the emitter and the control circuitry, and having an opening in which the DOE is mounted; and
conductive traces, which are embedded in the housing and connect the transparent conductive trace disposed over the surface of the DOE to the control circuitry.

12. The module according to claim 11, wherein the housing comprises a plastic material, and the conductive traces comprise metal leads, which are molded into the plastic material.

13. The module according to claim 11, wherein the conductive traces comprise a metal plated onto an inner surface of the housing.

14. A method for projecting light, comprising:
providing a diffractive optical element (DOE) having a transparent conductive trace disposed over a surface of the DOE;
directing a beam of optical radiation from an emitter through the DOE;
measuring a resistance of the transparent conductive trace; and
controlling operation of the emitter responsively to the resistance.

15. The method according to claim 14, wherein an increase in the resistance is indicative of a break in the transparent conductive trace, and wherein controlling the operation comprises inhibiting the operation of the emitter responsively to the increase in the resistance.

16. The method according to claim 14, wherein the transparent conductive trace is disposed in a serpentine pattern across an active optical area of the DOE.

17. The method according to claim 14, wherein the DOE comprises a transparent substrate having a first index of refraction at an emission wavelength of the optical radiation, and the transparent conductive trace has a second index of refraction at the emission wavelength of the emitter, and the method comprises disposing an index-matching layer, which has a third index of refraction, intermediate the first and second indexes of refraction, at the emission wavelength, between the transparent substrate and the transparent conductive trace.

18. The method according to claim 14, wherein the emitter and the control circuitry are disposed in a housing having an opening in which the DOE is mounted, and the method comprises embedding conductive traces in the housing so as to connect the transparent conductive trace disposed over the surface of the DOE to control circuitry, which measures the resistance of the transparent conductive trace and controls the operation of the emitter responsively thereto.

19. The method according to claim 18, wherein the housing comprises a plastic material, and embedding the conductive traces comprises molding metal leads into the plastic material.

20. The method according to claim 18, wherein embedding the conductive traces comprises plating a metal onto an inner surface of the housing.

* * * * *